(12) United States Patent
Greither

(10) Patent No.: US 12,312,094 B2
(45) Date of Patent: May 27, 2025

(54) AIRCRAFT SOLID SATE POWER CONTROLLER AND AIRCRAFT ELECTRIC POWER SUPPLY SYSTEM

(71) Applicant: HS Elektronik Systeme GmbH, Nördlingen (DE)

(72) Inventor: Markus Greither, Augsburg (DE)

(73) Assignee: HS ELEKTRONIK SYSTEME GMBH, Nördlingen (DE)

( * ) Notice: Subject to any disclaimer, the term of this patent is extended or adjusted under 35 U.S.C. 154(b) by 5 days.

(21) Appl. No.: 18/241,274

(22) Filed: Sep. 1, 2023

(65) Prior Publication Data
US 2024/0076054 A1 Mar. 7, 2024

(30) Foreign Application Priority Data
Sep. 2, 2022 (DE) .......................... 102022122243.8

(51) Int. Cl.
*B64D 41/00* (2006.01)
*H02M 1/00* (2007.01)
*H02M 3/158* (2006.01)

(52) U.S. Cl.
CPC .......... *B64D 41/00* (2013.01); *H02M 1/0022* (2021.05); *H02M 3/158* (2013.01); *B64D 2221/00* (2013.01)

(58) Field of Classification Search
CPC . B64D 41/00; B64D 2221/00; H02M 1/0022; H02M 3/158; H02H 3/087;
(Continued)

(56) References Cited

U.S. PATENT DOCUMENTS

| 7,760,005 B2* | 7/2010 | de Rooij | H03K 17/74 |
| | | | 327/108 |
| 11,101,643 B2* | 8/2021 | Handy | H03K 17/08122 |

(Continued)

FOREIGN PATENT DOCUMENTS

| CN | 111969841 A | 11/2020 |
| CN | 112769425 A | 5/2021 |

(Continued)

OTHER PUBLICATIONS

Abstract of CN111969841A, Published: Nov. 20, 2020, 1 page.
Abstract of CN112769425A, Published: May 7, 2021, 1 page.

*Primary Examiner* — Jared Fureman
*Assistant Examiner* — Michael J Warmflash
(74) *Attorney, Agent, or Firm* — CANTOR COLBURN LLP

(57) ABSTRACT

An aircraft solid state power controller for controlling electric power in an aircraft comprises: a solid state power switching device for switching the electric power, the solid state power switching device comprising an input node, an output node and a control node; a first bypass diode electrically connected between the input node of the solid state power switching device and the control node of the solid state power switching device; and a switchable bypass electrically connected between the input node of the solid state power switching device, and the output node of the solid state power switching device. The switchable bypass comprises a second bypass diode and a bypass switch. An electric bypass current ($I_{bypass}$) flowing through the second bypass diode is switchable by switching the bypass switch on and off. The aircraft solid state power controller further comprises a bypass controller configured for switching the bypass switch on/off.

16 Claims, 3 Drawing Sheets

(58) Field of Classification Search
CPC ............. H03K 17/0822; H03K 17/122; H03K 17/284; H03K 17/08142
See application file for complete search history.

(56) References Cited

U.S. PATENT DOCUMENTS

| | | | | |
|---|---|---|---|---|
| 2008/0238520 | A1* | 10/2008 | de Rooij | H03K 17/0414 |
| | | | | 327/310 |
| 2013/0021700 | A1* | 1/2013 | Greither | H03K 17/0822 |
| | | | | 361/56 |
| 2016/0311327 | A1* | 10/2016 | Nakahara | H03K 17/0822 |
| 2018/0367133 | A1* | 12/2018 | Yano | H02H 9/04 |
| 2021/0376600 | A1* | 12/2021 | Torres | H02H 9/046 |
| 2024/0103093 | A1* | 3/2024 | Greither | H02H 3/243 |
| 2024/0103094 | A1* | 3/2024 | Greither | G01R 31/008 |

FOREIGN PATENT DOCUMENTS

| | | | |
|---|---|---|---|
| EP | 2757688 | B1 | 5/2019 |
| EP | 2961069 | B1 | 11/2020 |

\* cited by examiner

AIRCRAFT SOLID SATE POWER CONTROLLER AND AIRCRAFT ELECTRIC POWER SUPPLY SYSTEM

CROSS REFERENCE TO RELATED APPLICATIONS

This application claims priority to German Patent Application No. 102022122243.8 filed Sep. 2, 2022, the entire contents of which is incorporated herein by reference.

TECHNICAL FIELD

The invention is related to aircraft solid state power controller ("SSPC") for controlling the supply of electric power from an electric power supply to at least one electric load within an aircraft. The invention is further related to an aircraft electric power supply system that comprises such an SSPC.

BACKGROUND

Modern aircraft usually comprise at least one aircraft solid state power controller ("SSPC") for controlling the supply of electric power from an electric power supply to at least one electric load within an aircraft. The at least one SSPC may in particular be configured to act as an electric safety device or circuit breaker, which interrupts the supply of electric power in case the electric current flowing through the SSPC exceeds a predefined threshold. When the supply of electric power to an inductive load that is electrically connected to the SSPC is interrupted, relatively high inductive voltages may be induced. Such inductive voltages may damage components of the SSPC or other electric components, which are electrically connected to the SSPC. High inductive voltages may in particular damage switched off solid state power switching devices that are employed within the SSPC for controlling the supply of electric power to the at least one electric load.

It therefore would be beneficial to provide an improved SSPC, which is capable of controlling and switching electric loads without being damaged, in particular without being damaged by high inductive voltages that are induced by inductive loads, when the electric power supplied by the SSPC is switched off.

SUMMARY

According to an exemplary embodiment of the invention, an SSPC for controlling the supply of electric power from an electric power supply to at least one electric load within an aircraft comprises a solid state power switching device for switching the electric power, a first bypass diode, and a switchable bypass. The solid state power switching device comprising an input node, an output node and a control node. The first bypass diode has a first node, which is electrically connected to the input node of the solid state power switching device, and a second node, which is electrically connected to the control node of the solid state power switching device.

The switchable bypass has a first node, which is electrically connected to the input node of the solid state power switching device, and a second node, which is electrically connected to the output node of the solid state power switching device. The switchable bypass comprises a second bypass diode and a bypass switch. The second bypass diode and the bypass switch are electrically connected with each other in a serial configuration so that an electric bypass current flowing through the second bypass diode is controllable by switching the bypass switch between a low resistance state ("on-state") and a high resistance state ("off-state"). The SSPC further comprises a bypass controller, which is configured for controlling the bypass switch, i.e. for switching the bypass switch between the low resistance on-state and the high resistance off-state.

Exemplary embodiments of the invention further include an aircraft electric power supply system comprising at least one electric load and at least one electric power supply for supplying electric power to the at least one electric load. The aircraft electric power supply system further comprises at least one SSPC according to an exemplary embodiment of the invention, which allows controlling, in particular switching, the supply of electric power from the at least one electric power supply to the at least one electric load.

Exemplary embodiments of the invention further include an aircraft with an aircraft electric power supply system according to an exemplary embodiment of the invention.

Exemplary embodiments of the invention also include a method of switching off an SSPC according to an exemplary embodiment of the invention, wherein the method includes: switching the bypass switch into a low resistance on-state in order to allow bypassing the solid state power switching device via the second bypass diode; and switching the solid state power switching device into a high resistance off-state, in which it does not supply any electric power to the at least one load. In a method according to an exemplary embodiment of the invention, the bypass switch is then switched into a high resistance off-state a predetermined period of time after the solid state power switching device has been switched into the high resistance off-state.

Alternatively or additionally to switching off the bypass switch after a predetermined amount of time, the method may include measuring the voltage between the input node and the output node of the solid state power switching device, comparing the measured voltage with a predefined threshold, and switching the bypass switch into the high resistance off-state when the measured voltage has dropped below the predefined threshold.

Activating the switchable bypass before the solid state power switching device is switched off allows dissipating the inductive voltage that is induced by the inductive load when the solid state power switching device is switched off through the second bypass diode of the switchable bypass. Dissipating the inductive voltage allows preventing that the solid state power switching device or any other electric components, which are electrically connected to the solid state power switching device, are damaged by the induced voltage and/or an induced electric current that is driven by the induced voltage, when the solid state power switching device is switched off.

According to the invention, the switchable bypass is deactivated after some time, after a considerable portion of the induced voltage has been dissipated, in order to prevent an undesirable overshooting of the bypass, which may result in an infinite clamping.

As a result, an SSPC according to an exemplary embodiment of the invention provides a reliable and durable SSPC, which is able to switch large electric powers, in particular high electric voltages of up to several thousands of volts and/or large electric currents of up to several thousands of amperes, without being damaged and without damaging electric components that are electrically connected to the SSPC.

The first and second bypass diodes may be semiconductor diodes. Semiconductor diodes provide reliable and durable diodes, which may be designed to withstand large electric loads, in particular high electric voltages and/or large electric currents. Semiconductor diodes are not affected by accelerations and vibrations, as they occur in an aircraft. They also have a long lifetime and may be produced at reasonable costs.

The solid state power switching device may be or may include an insulated-gate bipolar transistor (IGBT) or a field-effect transistor (FET), in particular a metal-oxide-semiconductor field-effect transistor (MOSFET). Insulated-gate bipolar transistors and field-effect transistors, in particular metal-oxide-semiconductor field-effect transistors, provide reliable and durable solid state power switching devices, which are capable to switch large electric loads, in particular high electric voltages and/or large electric currents. Such transistors are not affected by accelerations and vibrations, as they occur in an aircraft. They also have a long lifetime and are available at reasonable costs.

If the solid state power switching device is a FET or a MOSFET, the first node of the first bypass diode may be electrically connected to the source of the FET or MOSFET and the second node of the first bypass diode may be electrically connected to the gate of the FET or MOSFET. In an alternative configuration, the first node of the first bypass diode may be electrically connected the drain of the FET or MOSFET, and the second node of the first bypass diode may be electrically connected to the gate of the FET or MOSFET.

In case the solid state power switching device is a FET or MOSFET, the first node of the switchable bypass may be electrically connected to the source of the FET or MOSFET, and the second node of the switchable bypass may be electrically connected to the drain of the FET or MOSFET. Alternatively, the first node of the switchable bypass may be electrically connected to the drain of the FET or MOSFET, and the second node of the switchable bypass may be electrically connected to the source of the FET or MOSFET.

The most appropriate of these configurations may be chosen based on the circumstances, such as the polarity of the voltage, which is to be switched by the solid state power switching device and/or the availability and configuration of the electric components, in particular the solid state power switching device.

The first and second bypass diodes may be Zener diodes or transient voltage suppressor diodes ("TVS diodes"), which are electrically connected to be operated in their respective blocking directions.

The second bypass diode may be a high power TVS diode, which is capable of withstanding transient voltages of up to 3000 V and transient currents of up to 10 kA.

The first bypass diode may have a first breakdown voltage Ubreak1 in the range of 1500 V to 2000 V, and the second bypass diode may have a second breakdown voltage Ubreak2 in the range of 1000 V to 3000 V.

In order to provide an SSPC that is capable to control very large electric powers, for example controlling electric powers of at least 250 kW, in particular to withstand electric powers of at least 500 kW, the second bypass diode may be configured to be able to withstand electric powers of at least 250 kW, in particular to withstand electric powers of at least 500 kW.

The SSPC, and in particular the solid state power switching device, may be configured to be able to switch electric voltages in the range of 1500 V to 3000 V, in particular for switching electric voltages in the range of 2000 V to 2500 V.

The SSPC, and in particular the solid state power switching device, may be configured to be able to switch electric currents in the range of 1000 A to 2000 A, in particular to switch electric voltages in the range of 1200 A to 1700 A.

The bypass switch, which is employed for activating and deactivating the switchable bypass, may also include a semiconductor switch. The bypass switch may, for example, include an IGBT or an FET, in particular a MOSFET. Such semiconductor switches provide reliable and durable switches, which are able to switch large electric loads and which are not affected by accelerations and/or vibrations, at reasonable costs.

The bypass controller may be configured for driving the bypass switch time-controlled. More specifically, the bypass controller may be configured for deactivating the bypass by switching off the bypass switch a predetermined period of time $\Delta T$ after the solid state power switching device has been switched off. Said predetermined period of time $\Delta T$ may, for example, be in a range of between 100 µs and 10 ms, in particular in a range of between 500 µs and 5 ms.

Driving the bypass switch time-controlled allows for a simple and inexpensive implementation of the bypass controller. In particular, no additional components, such as sensors, are necessary for driving the bypass switch time-controlled.

The SSPC may also comprise a voltage sensor for measuring the voltage between the input node and the output node of the solid state power switching device, which is defined by the breakdown voltage of the second bypass diode (TVS diode). In such a configuration, the bypass controller may be configured for driving the bypass switch based on the voltage measured by the voltage sensor. Driving the bypass switch based on the voltage measured by the voltage sensor allows deactivating the switchable bypass as soon as the voltage between the input node and the output node of the switchable bypass has dropped below a predefined threshold.

The bypass controller may, for example, be configured for deactivating the switchable bypass by switching off the bypass switch when the voltage measured by the voltage sensor has dropped below 1500 V.

BRIEF DESCRIPTION OF THE DRAWINGS

In the following, an exemplary embodiment of the invention is described with reference to the enclosed figures.

DETAILED DESCRIPTION

Figure 1:
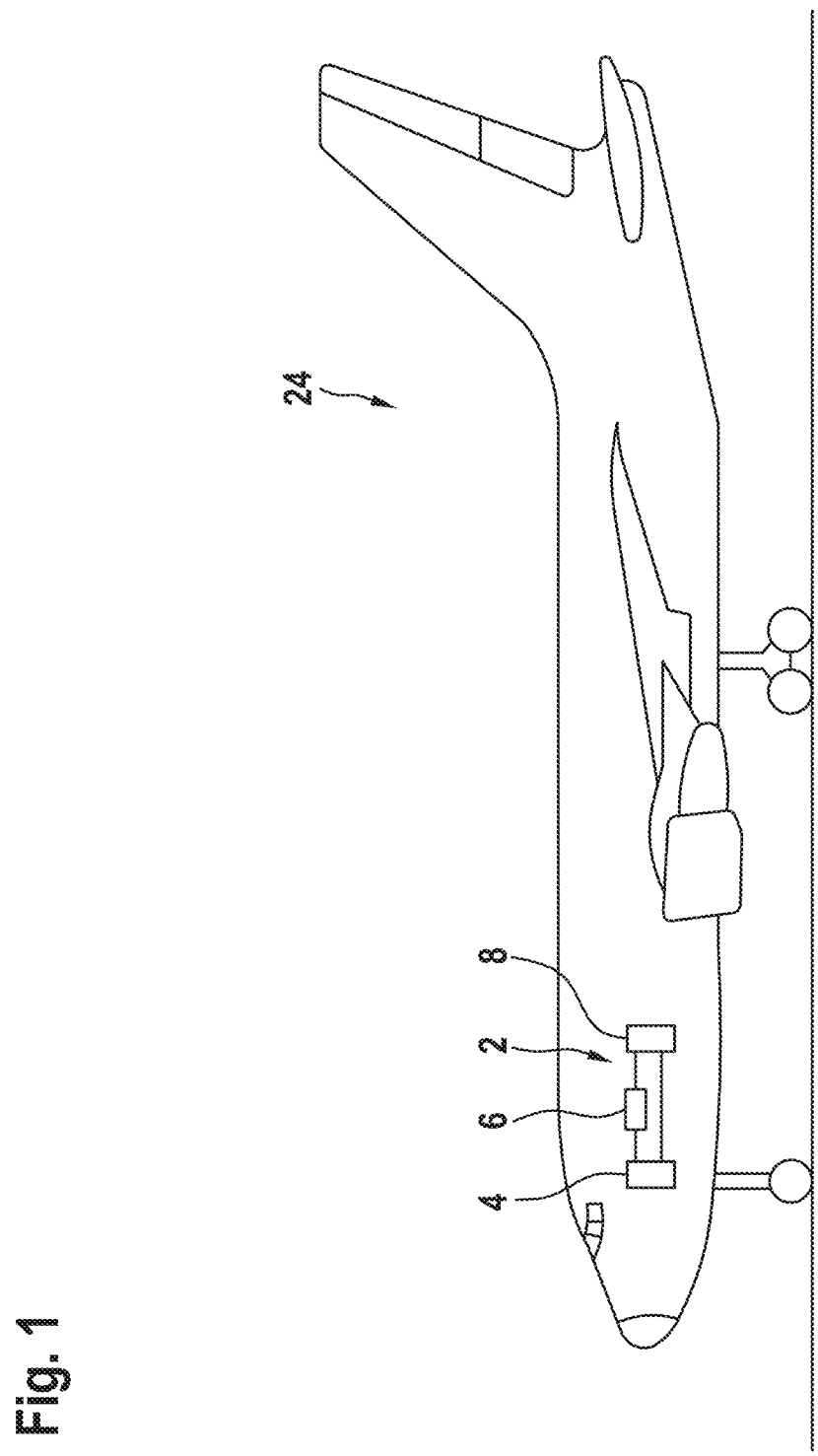
FIG. 1 depicts an aircraft with an SSPC according to an exemplary embodiment of the invention.

FIG. 1 shows an aircraft 24, in particular an airplane, which is equipped with an electric power supply system 2 including an electric power supply 4, an electric load 6, and an aircraft solid state power controller (SSPC) 5 according to an exemplary embodiment of the invention. Although the electric power supply system 2 depicted in FIG. 1, includes only on electric power supply 4, one electric load 6, and one SSPC with a single SSPC channel.

Typical embodiments of electric power supply systems 2 may comprise more the one of each of said components, respectively.

An electric power supply system 2 may in particular include a plurality of SSPCs, with each SSPC including numerous SSPC channels of the type depicted in FIG. 1 and described in the following.

Figure 2:
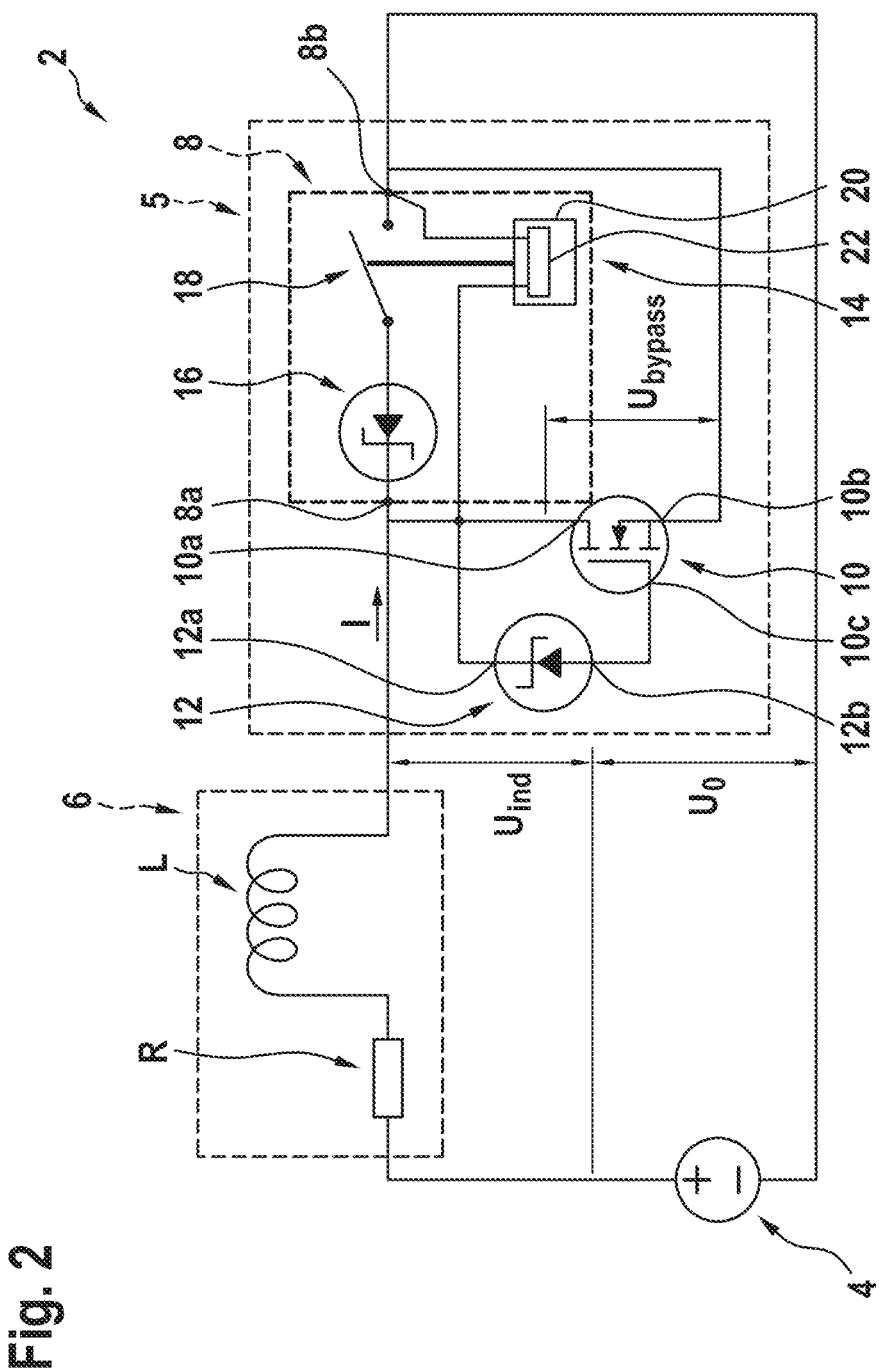
FIG. 2 depicts a circuit diagram of an electric circuit with an SSPC according to an exemplary embodiment of the invention.

FIG. 2 shows a circuit diagram of the electric power supply system 2 depicted in FIG. 1. The electric power supply system 2 comprises an electric power supply 4, in particular a DC electric power supply 4, an electric load 6, which includes a resistive component R and an inductive component L, and an SSPC (or an SSPC channel) 5 according to an exemplary embodiment of the invention.

In the embodiment depicted in FIG. 2, the electric load 6 is connected between the positive pole of the DC electric power supply 4 and the SSPC 5. In an alternative embodiment, which is not explicitly shown in the figures, the electric load 6 may be connected between the negative pole of the DC electric power supply 4 and the SSPC 5.

The electric load 6 may be selectively supplied with electric power from the electric power supply 4 by controlling, in particular by switching, the SSPC 5.

The SSPC 5 comprises a solid state power switching device 10, which is configured for controlling/switching the electric power that is supplied by the electric power supply 4 to the electric load 6. The solid state power switching device 10 may be an insulated-gate bipolar transistor (IGBT) or a field effect transistor (FET), in particular a metal-oxide-semiconductor field-effect transistor (MOSFET).

The solid state power switching device may be configured for switching electric voltages in the range of 1500 V to 3000 V, in particular for switching electric voltages in the range of 2000 V to 2500 V.

The solid state power switching device may be configured for switching electric currents in the range of 1000 A to 2000 A, in particular for switching electric voltages in the range of 1200 A to 1700 A.

The solid state power switching device 10 has an input node 10a, an output node 10b and a control node 10c.

In case the solid state power switching device 10 is an IGBT, the input node 10a may be the collector or the emitter of the IGBT, and the output node 10b may be the other one of the collector an the emitter. The control node 10c may be the gate of the IGBT.

In case the solid state power switching device 10 is a FET or a MOSFET, as it is depicted in FIG. 2, the control node 10c may be the gate of the FET/MOSFET.

The input node 10a may be the source of the FET/MOSFET, and the output node 10b may be the drain of the FET/MOSFET. Alternatively, the input node 10a may be the drain of the FET/MOSFET, and the output node 10b may be the source of the FET/MOSFET.

The SSPC 5 further comprises a first bypass diode 12 having a first node 12a and a second node 12b. The first bypass diode 12 may be a semiconductor diode.

The first node 12a of the first bypass diode 12 is electrically connected to the input node 10a of the solid state power switching device 10. The second node 12b of the first bypass diode 12 is electrically connected to the control node 10c of the solid state power switching device 10.

The first bypass diode 12 is a Zener-Diode or a TVS diode having a first breakdown voltage Ubreak1. The first breakdown voltage Ubreak1 is an intrinsic parameter of the first bypass diode 12. The first bypass diode 12 is electrically connected in its blocking direction to the solid state power switching device 10. In consequence, under normal operating conditions, when the voltage applied to the first bypass diode 12 in its blocking direction, is below the first breakdown voltage Ubreak1, the first bypass diode 12a blocks and appears as an open electric circuit.

When the electric voltage, which is applied to the first bypass diode 12 in its blocking direction, exceeds the first breakdown voltage Ubreak1, the first bypass diode 12 avalanches and provides a low impedance electric path between its two nodes 12a, 12b. In consequence, the first bypass diode 12 appears as a closed electric circuit and an electric voltage is applied to the control input 10c of the solid state power switching device 10.

The SSPC 5 further comprises a switchable bypass with a first bypass node 8a and a second bypass node 8b.

The first bypass node 8a is electrically connected to the input node 10a (e.g. the source or the drain) of the solid state power switching device 10, and the second bypass node 8b is electrically connected to the output node 10c (e.g. the drain or the source) of the solid state power switching device 10.

The switchable bypass 8 comprises a second bypass diode 16 and a bypass switch 18. The bypass switch 18 may be or may include a semiconductor switch, such as an IGBT, a FET or a MOSFET.

The second bypass diode 16 and the bypass switch 18 are serially electrically connected with each other. In consequence, an electric bypass current flowing through the second bypass diode 16 is switchable by controlling the bypass switch 18.

The second bypass diode 16 is a high power bypass diode, in particular a high power transient voltage suppressor diode (TVS diode). The second bypass diode 16 has a second breakdown voltage Ubreak2. The second breakdown voltage Ubreak2 is an intrinsic parameter of second first bypass diode 16.

The second bypass diode 16 is electrically connected in its blocking direction. When an electric voltage that is below the second breakdown voltage Ubreak2 is applied to the second bypass diode 16 in its blocking direction, the second bypass diode 16 blocks any electric current from flowing through the second bypass diode 16. In consequence, it appears as an open electric circuit.

When the electric voltage, which is applied to the second bypass diode 16 in its blocking direction, exceeds the second breakdown voltage Ubreak2, the second bypass diode 16 avalanches and provides a low impedance path between its two nodes. In consequence, the second bypass diode 16 appears as a closed electric circuit.

The second bypass diode 16 may have a second breakdown voltage Ubreak2 in the range of 1000 V to 3000 V, and is capable to handle electric currents of up to 10 kA. The second bypass diode 16 may in particular be configured to withstand electric powers of up to 250 kW, in particular to withstand electric powers of up to 500 kW.

The SSPC 5 further comprises a bypass switch controller 20, which is configured for controlling the bypass switch 18 to switch between a high resistive on-state and a low resistive off-state.

In the following, an example of operating the SSPC 5 and in particular controlling the bypass switch 18 is described with reference to FIG. 3.

Figure 3:
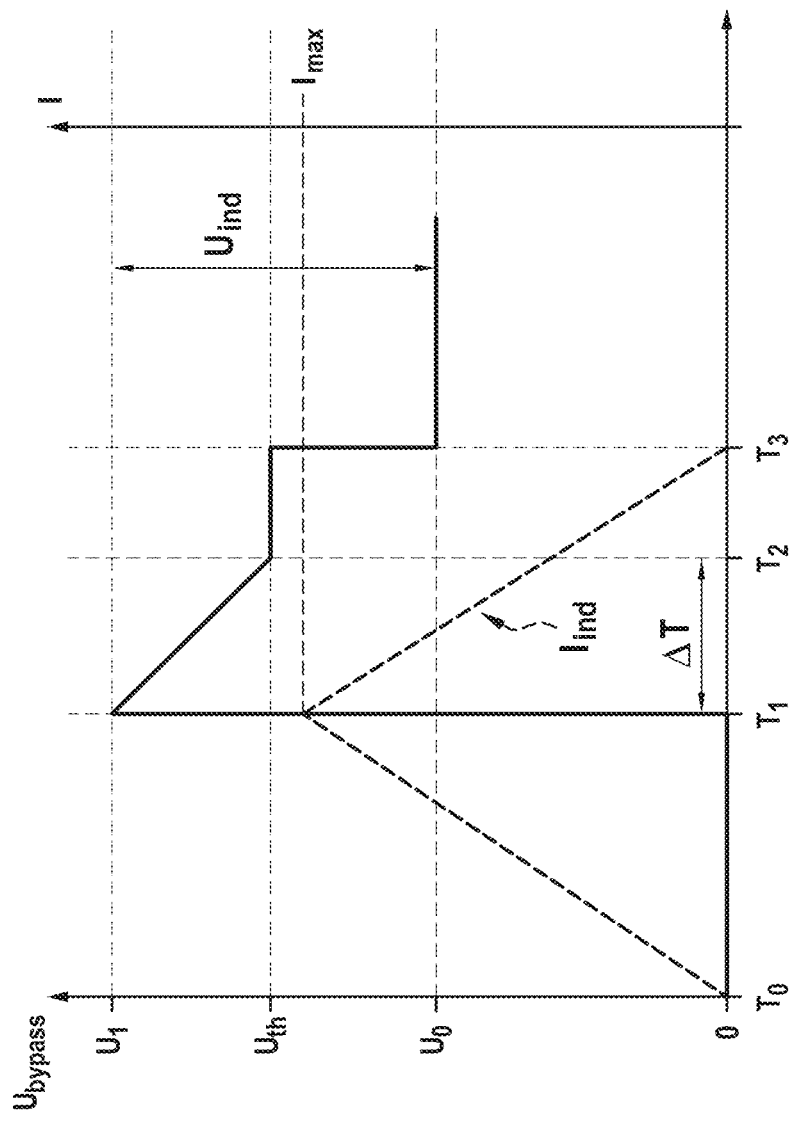
FIG. 3 depicts a plot showing the electric current flowing through the electric load and the electric voltage at a solid state power switching device of an SSPC according to an exemplary embodiment of the invention as a function of time.

FIG. 3 shows a graph, in in which the electric current I flowing through the electric load 6 and the electric voltage Ubypass between the input node 10a and the output node 10b of the solid state power switching device 10 are plotted on the vertical axis over time t, which is plotted on the horizontal axis. The electric current I is plotted as a dashed line, and the electric voltage Ubypass is plotted as a solid line.

During a first period of time T0<t1<T1, the solid state power switching device 10 is switched on, i.e. the solid state power switching device 10 is switched into a low resistance on-state, in which there is no significant electric potential difference or voltage Ubypass between the input node 10a and the output node 10b of the solid state power switching device 10 (Ubypass=0). (Due to the physical properties of the solid state power switching device 10, there may be a small potential difference or voltage Ubypass of less than 3 V between the input node 10a and the output node 10b. This potential difference, however, is negligible in the context of the present invention.)

At t=T1, the electric current I, which flows through the electric load 6, and which is indicated by the dashed line, reaches a predefined maximum value Imax. When the electric current I reaches the predefined maximum value Imax, the solid state power switching device 10 is switched into a high resistance off-state by an overelectric current detector or "electric current limiter", which is not depicted in FIG. 2.

Switching of the electric power that is supplied to the electric load 6, induces an inductive voltage Uind in the inductive component L of the electric load 6. The induced inductive voltage Uind adds to the voltage U0 ("bus voltage U0") supplied by the electric power supply 4. This results in a relatively high voltage U1, which is the sum U1=Uind+U0 of the induced inductive voltage Uind and the bus voltage U0, between the input node 10a and the output node 10b of the solid state power switching device 10.

In order to prevent the solid state power switching device 10 (or another electric component of the SSPC 2) from being damaged by a high induced inductive voltage Uind, the bypass switch 18 of the switchable bypass 8 has been switched on for activating the switchable bypass 8 before the solid state power switching device 10 has been switched off. As a result, the high voltage U1=Uind+U0 is applied to the second bypass diode 16.

If the high voltage U1 exceeds the second breakdown voltage Ubreak2 of the second bypass diode 16, which is usually the case, an induced electric current Iind, which is driven by the high voltage U1, may bypass the solid state power switching device 10 through the switchable bypass 8, i.e. through the second bypass diode 16 and the bypass switch 18, which is switched on.

As a result of bypassing the solid state power switching device 10 via the second bypass diode 16, the voltage U1 between the input node 10a and the output node 10b of the solid state power switching device 10 drops during a second time period T1<t2 T2.

Due to the physical properties of the second bypass diode (high power TVS diode) 16, the induced electric current Iind flowing through the second bypass diode 16 causes the second breakdown voltage Ubreak2 of the second bypass diode 16 to drop during the second time period T1<t<T2. There is a risk that the second breakdown voltage Ubreak2 of the second bypass diode 16 drops even below the bus voltage U0. This would result in short-ciruiting the electric power supply 4.

It has been found difficult or even impossible to select a second bypass diode 16 so has a suitable second breakdown voltage Ubreak2 at the beginning of the clamping, when the induced voltage Uind is high, and which also provides a sufficiently high second breakdown voltage Ubreak2 at the end of the clamping, when the induced voltage Uind is relatively low, in order to prevent short-ciruiting the electric power supply 4.

According to the invention, this problem is solved by deactivating the switchable bypass 8 with the second bypass diode 16 by switching off the bypass switch 18 at a time t=T2.

The bypass switch 18 is controlled by a bypass switch controller 20, which is configured for switching the bypass switch 18 on and off.

The bypass switch controller 20 may be configured for driving the bypass switch 18 time-controlled. In other words, the bypass switch controller 20 may be configured for switching off the bypass switch 18 a predetermined amount of time after the solid state power switching device 10 has been switched off. The bypass switch controller 20 may in particular be configured for switching off the bypass switch 18 after a time period ΔT=T2−T1, which is in the range of 100 μs to 10 ms, after the solid state power switching device 10 has been switched of g at time t=T2.

Alternatively or additionally, the bypass switch controller 20 may comprise a voltage sensor 22, which is configured for detecting the voltage Ubypass between the first and second nodes 8a, 8b of the switchable bypass 8. In such a configuration, the bypass switch controller 20 may be configured for switching off the bypass switch 18, when the voltage Ubypass between the first and second nodes 8a, 8b of the switchable bypass 8 has dropped below a predefined voltage Uoff, for example below a predefined voltage Uoff of 1500 V.

After the switchable bypass 8 has been deactivated by switching off the bypass switch 18, the solid state power switching device 10 is (at least partially) switched on, i.e. brought into an at least partially conducting low resistive state, during the following time period T2<t<T3 by an electric voltage UG that is applied to the control input 10c of the solid state power switching device 10 via the first bypass diode 12. The first bypass diode 12 is conductive and applies an electric voltage UG to the control input 10c of the solid state power switching device 10 as long as the voltage that is applied to the first bypass diode 12 exceeds the first breakdown voltage Ubreak1 of the first bypass diode 12.

In consequence, the remaining induced voltage Uind, which is still present between the input and output nodes 10a, 10b of the solid state power switching device 10 after the bypass switch 18 has been switched off, is reduced further due to an electric current Iind, which flows though the solid state power switching device 10 until the voltage Ubypass1 applied to the first bypass diode 12 drops below the first breakdown voltage Ubreak1 of the first bypass diode 12. When the voltage Ubypass1 applied to the first bypass diode 12 drops below the first breakdown voltage Ubreak1 of the first bypass diode 12, the first bypass diode 12 blocks and no electric voltage is applied to the control input 10c of the solid state power switching device 10. In consequence, the solid state power switching device 10 is switched off.

At t=T3 the induced inductive voltage Uind has been completely dissipated so that only the bus voltage U0, which is supplied by the electric power supply 4, is applied to the input node 10a and the output node 10b of the solid state power switching device 10.

In an SSPC 5 according to an exemplary embodiment of the invention, the electric current Iind dissipating the inductive voltage Uind, which is induced when the solid state power switching device 10 is switched off, flows through the second bypass diode 16 during the first time period T1<t<T2 in which the electric bypass 8 is switched on. In the following second time period T2<t<T3, the electric bypass 8 is switched off and the remaining inductive voltage Uind is dissipated by an electric current Iind that flows through the solid state power switching device 10, which is at least partially switched on due to a voltage that is applied to the control input 10c of the solid state power switching device 10 via the first bypass diode 12.

As the solid state power switching device 10 is (at least partially) switched on, only a small electric current, which is sufficient for switching on the solid state power switching device 10, flows through the first bypass diode 12. In consequence, the first bypass diode 12 does not need to be designed to withstand large electric currents. The first bypass diode 12 may therefore be a conventional Zener diode with a first breakdown voltage Ubreak1 in the range of 1500 V to 2000 V, and it its sufficient that it is capable to withstand transient electric currents of up to 10 kA.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed, but that the invention will include all embodiments falling within the scope of the appended claims.

The invention claimed is:

1. An aircraft solid state power controller configured to receive a bus voltage ($U_0$) for controlling the supply of electric power in an aircraft, the aircraft solid state power controller comprising:
   a solid state power switching device for switching the electric power, the solid state power switching device comprising an input node, an output node and a control node;
   a first bypass diode, wherein a first node of the first bypass diode is electrically connected to the input node of the solid state power switching device and wherein a second node of the first bypass diode is electrically connected to the control node of the solid state power switching device; and
   a switchable bypass, wherein a first node of the switchable bypass is electrically connected to the input node of the solid state power switching device, and wherein a second node of the switchable bypass is electrically connected to the output node of the solid state power switching device,
   wherein the switchable bypass comprises:
      a second bypass diode; and
      a bypass switch,
      wherein the second bypass diode and the bypass switch are serially electrically connected with each other so that an electric bypass current ($I_{bypass}$) flowing through the second bypass diode is switchable by switching the bypass switch on and off; and
      wherein the aircraft solid state power controller further comprises a bypass controller, which is configured for switching the bypass switch on and off;
   wherein the bypass controller is configured to switch the bypass switch on before the solid state power switching device is switched on; and
   wherein the bypass controller is configured to switch the bypass switch off before the breakdown voltage ($U_{break2}$) of the second bypass diode drops below the bus voltage ($U_0$).

2. The aircraft solid state power controller according to claim 1,
   wherein the solid state power switching device is a field-effect transistor, in particular a metal-oxide-semiconductor field-effect transistor,
   wherein the first node of the first bypass diode is electrically connected to one of the source and the drain of the field-effect transistor, and the second node of the first bypass diode is electrically connected to the gate of the field-effect transistor, and
   wherein the first node of the switchable bypass is electrically connected to one of the source and the drain of the field-effect transistor, and wherein a second node of the switchable bypass is electrically connected the other of the source and the drain of the field-effect transistor.

3. The aircraft solid state power controller according to claim 1, wherein the first and second bypass diodes are Zener diodes or TVS diodes, which are connected to be operated in their respective blocking directions, wherein the first bypass diode has in particular a first breakdown voltage ($U_{break1}$) in the range of 1000 V to 3000 V, and wherein the second bypass diode has in particular a second breakdown voltage ($U_{break2}$) in the range of 1500 V to 2000 V.

4. The aircraft solid state power controller according to claim 1, wherein the bypass switch is a semiconductor switch.

5. The aircraft solid state power controller according to claim 4, wherein the bypass switch is a FET, a MOSFET or an IGBT.

6. The aircraft solid state power controller according to claim 1, wherein the bypass controller is configured for driving the bypass switch time-controlled.

7. The aircraft solid state power controller according to claim 5, wherein the bypass controller is configured for switching the bypass switch off a predetermined period of time ($\Delta T$) after the solid state power switching device has been switched off, wherein the predetermined period of time ($\Delta T$) is in the range of between 100 μs and 10 ms.

8. The aircraft solid state power controller according to claim 1, further comprising a voltage sensor for measuring a voltage ($U_{bypass}$) between the input node and the output node of the solid state power switching device or a voltage ($U_{bypass}$) between the two nodes of the second bypass diode, wherein the bypass controller is configured for driving the bypass switch based on the voltage ($U_{bypass}$) measured by the voltage sensor.

9. The aircraft solid state power controller according to claim 8, wherein the bypass controller is configured for switching off the bypass switch if the voltage ($U_{bypass}$) measured by the voltage sensor has dropped below a predefined threshold voltage ($U_{th}$) of 1500 V.

10. The aircraft solid state power controller according to claim 1, wherein the solid state power switching device and the second bypass diode are configured to withstand electric powers of at least 250 kW.

11. The aircraft solid state power controller according to claim 1, wherein the aircraft solid state power controller is a solid state power switching device, configured for controlling electric voltages in the range of 1500 V to 3000 V.

12. The aircraft solid state power controller according to claim 1, wherein the solid state power switching device is for switching electric currents in the range of 1000 A to 2000 A.

13. The aircraft solid state power controller according to claim 1, wherein the solid state power switching device is configured for switching electric powers of at least 250 kW.

14. An aircraft electric power supply system comprising:
at least one electric power supply, which is configured for supplying electric power;
at least one electric load; and
at least one aircraft solid state power controller according to claim 1, which is configured for controlling the electric power that is supplied from the at least one electric power supply to the at least one electric load.

15. An aircraft comprising:
an aircraft solid state power controller according to claim 1.

16. A method of switching off an aircraft solid state power controller according to claim 1, wherein the method includes:
switching on the bypass switch for bypassing the solid state power switching device via the second bypass diode;
switching off the solid state power switching device;
switching off the bypass switch a predetermined amount of time ($\Delta T$) after the solid state power switching device has been switched off;
or
measuring the voltage ($U_{bypass}$) between the input node and the output node of the solid state power switching device or a voltage ($U_{bypass}$) between the two nodes of the second bypass diode and comparing the measured voltage ($U_{bypass}$) with a predefined threshold voltage ($U_{th}$); and switching off the bypass switch if the measured voltage ($U_{bypass}$) is below the predefined threshold voltage ($U_{th}$).

* * * * *